(12) United States Patent
Guardado et al.

(10) Patent No.: US 6,222,990 B1
(45) Date of Patent: Apr. 24, 2001

(54) HEATING ELEMENT FOR HEATING THE EDGES OF WAFERS IN THERMAL PROCESSING CHAMBERS

(75) Inventors: Julio Guardado, Milpitas; Paul J. Timans, Mountain View, both of CA (US)

(73) Assignee: Steag RTP Systems, San Jose, CA (US)

( * ) Notice: Subject to any disclaimer, the term of this patent is extended or adjusted under 35 U.S.C. 154(b) by 0 days.

(21) Appl. No.: 08/984,652

(22) Filed: Dec. 3, 1997

(51) Int. Cl.[7] .................................................... A21B 2/00
(52) U.S. Cl. ........................... 392/416; 219/390; 118/724
(58) Field of Search ................................. 219/390, 405, 219/411; 118/50.1, 724, 725; 392/416, 418

(56) References Cited

U.S. PATENT DOCUMENTS

| | | | |
|---|---|---|---|
| 4,113,547 | * | 9/1978 | Katz et al. ............................. 156/612 |
| 4,469,529 | | 9/1984 | Mimura . |
| 4,493,977 | * | 1/1985 | Arai et al. ............................. 219/411 |
| 4,535,227 | * | 8/1985 | Shimizu ................................ 219/411 |
| 4,535,228 | | 8/1985 | Mimura et al. . |
| 4,751,370 | * | 6/1988 | Crossley et al. ...................... 219/461 |
| 4,789,771 | * | 12/1988 | Robinson et al. .................... 219/405 |
| 4,891,499 | | 1/1990 | Moslehi . |
| 5,294,778 | * | 3/1994 | Carman et al. ....................... 219/385 |
| 5,315,092 | * | 5/1994 | Takahashi et al. ................... 219/497 |
| 5,414,244 | * | 5/1995 | Imahashi .............................. 219/497 |
| 5,467,220 | | 11/1995 | Xu . |
| 5,551,982 | * | 9/1996 | Anderson et al. .................... 118/715 |
| 5,830,277 | * | 11/1998 | Johnsguard et al. ................. 118/725 |
| 5,831,249 | * | 11/1998 | Rohner et al. ........................ 219/413 |
| 5,848,889 | * | 12/1998 | Tietz et al. ............................ 432/258 |

* cited by examiner

Primary Examiner—Teresa Walberg
Assistant Examiner—Shawntina T. Fuqua
(74) Attorney, Agent, or Firm—Dority & Manning, PA

(57) ABSTRACT

The present invention is directed to an apparatus and process for heat treating wafers, such as semiconductor wafers, in thermal processing chambers. In particular, the apparatus of the present invention includes an electrical heating element positioned along the edges of a wafer contained in the thermal processing chamber. The electrical heating element which can be made, for instance, from silicon, silicon carbide or graphite, radiates heat towards the edges of the wafer during processing. The heating element is designed to compensate for heat losses that occur at the wafer's edge.

24 Claims, 4 Drawing Sheets

HEATING ELEMENT FOR HEATING THE EDGES OF WAFERS IN THERMAL PROCESSING CHAMBERS

FIELD OF THE INVENTION

The present invention is generally directed to a method and apparatus for heat treating wafers in a thermal processing chamber. More particularly, the present invention is directed to an apparatus and method for compensating for heat loss at the edges of a wafer during heat treatment. In one embodiment, for instance, an electrical heating element in the shape of a ring is placed adjacent to the edges of a wafer which heats the edges during processing.

BACKGROUND OF THE INVENTION

A thermal processing chamber as used herein, refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

Many semiconductor heating processes require a wafer to be heated to high temperatures so that various chemical and physical transformations can take place as the wafer is fabricated into a device. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer due to heat loss that occurs at the edge of the wafer. For instance, due to the increased surface area to volume ratio, the edges of semiconductor wafers tend to lose more heat by radiation than the surfaces of the wafer. Many thermal processing chambers are also constructed such that the central region of the wafer is surrounded by highly reflective surfaces, while the edges of the wafer face less reflective surfaces. This arrangement causes the wafer to heat up nonuniformly and for the edges of the wafer to have an increased tendency to loose heat in comparison to the top and the bottom of the wafer.

The above problems with heat loss through the edges of the wafer can further be compounded if the wafer is exposed to a flow of gas during heat treatment. In particular, when the wafer is exposed to a flow of gas, increased convective cooling may occur at the edges of the wafer. Ultimately, these energy losses can create different temperatures zones within the wafer during heat treatment, which adversely impacts upon the ability of the process to produce precise and uniform semiconductor devices.

Currently, in order to diminish the effect of heat losses, passively heated slip-free rings are sometimes placed adjacent to the edges of the wafer. For instance, slip-free rings, which are usually made from silicon or silicon carbide, are designed to surround the wafer so that the wafer is positioned within the inside diameter of the ring. During operation of the thermal processing chamber, the ring absorbs energy being emitted by the heater lamps and then radiates the energy back to the edges of the wafer. The ring can also reflect thermal radiation being emitted by the edge of the wafer back onto the wafer. In this manner, the passively heated ring compensates for heat loss at the edge of the wafer and also reduces convective cooling of the wafer if process gases are flowing through the chamber.

Although providing improvements in the ability to more uniformly heat semiconductor wafers, passive slip-free rings used in the past do present a number of limitations and disadvantages. For instance, the slip-free rings can absorb large amounts of energy from the heat source that is used to heat the wafers, thus increasing energy demands for the system. Also, because the slip-free rings are passively heated, the rings must be designed to effectively absorb heat. Consequently, the rings can only have a limited number of shapes.

Another problem that has been experienced in the past with slip-free rings is the ability to maintain the ring in alignment with a semiconductor wafer that is being heated. Further, passively heated rings offer little control over the rate at which the rings are heated or cooled. It would be desirable if the temperature of the rings could be controlled in conjunction with a heat treating process.

In this regard, various attempts have been made in the past to design heating elements that are heated by electrical resistance and shaped to surround the wafer. For instance, such heating elements are disclosed in U.S. Pat. No. 4,469,529 to Mimura, U.S. Pat. No. 4,493,977 to Arai, et al., U.S. Pat. No. 4,535,227 to Shimizu and U.S. Pat. No. 4,535,228 to Mimura, et al.. In these references, the heating elements include a filament, such as made from a metal, that is surrounded by a tube made of, for instance, silica glass.

Further improvements in methods and devices for compensating for heat loss at a wafer's edge, however, are still needed. As will be made apparent from the following description, the present invention is directed to further improvements in such devices.

SUMMARY OF THE INVENTION

The present invention recognizes and addresses the foregoing disadvantages, and others of prior art constructions and methods.

Accordingly, it is an object of the present invention to provide an improved method and apparatus for heat treating objects, such as wafers.

Another object of the present invention is to provide an improved apparatus for heat treating wafers that includes an electrical heating element that heats the edges of the wafer during heat treatment.

Still another object of the present invention is to provide a thermal processing chamber that contains an electrical heating element for heating the edges of a wafer in which the electrical heating element has a height substantially greater than the thickness of the wafer for preventing alignment problems and problems with mechanical tolerances.

Another object of the present invention is to provide a thermal processing apparatus containing an electrical heating element for heating the edges of a wafer that is made from materials that are compatible with heat treating processes, such as silicon, silicon carbide, graphite, and the like.

Another object of the present invention is to provide a thermal processing chamber that contains an electrical heating element for heating the edges of a wafer that is in the shape of a discontinuous ring.

It is another object of the present invention to provide an apparatus for heat treating wafers that contains an electrical heating element for heating the edges of a wafer and which is in communication with a controller that automatically monitors and controls the temperature of the electrical heating element and/or the wafer.

These and other objects of the present invention are achieved by providing an apparatus for heat treating devices which includes a thermal processing chamber adapted to contain wafers. Specifically, the thermal processing chamber includes a substrate holder for holding the wafers and a heat source for heat treating the wafers positioned on the substrate holder.

In accordance with the present invention, the apparatus further includes an electrical heating element having a shape configured to surround the peripheral edges of a wafer positioned on the substrate holder. The electrical heating element is made from an electrically conductive material capable of being heated by electrical resistance. The electrically conductive material, for instance, can comprise a material such a silicon, silicon carbide, graphite or mixtures thereof. In one embodiment, the electrical heating element can be in the shape of a solid ring made from the electrically conductive material. Preferably, the ring has a vertical height that is substantially greater than the thickness of a wafer positioned on the substrate holder. For instance, the vertical height can be at least 0.5 millimeters, such as from about 1 millimeter to about 10 millimeters. More particularly, the vertical height can be from about 2 millimeters to about 7 millimeters.

When in the shape of a circular ring, the electrical heating element can be discontinuous. As used herein, discontinuous means that the ring does not form a complete circle, but, instead, includes at least one gap or interruption in the structure. The electrical heating element can include at least two electrical terminals adapted to be connected to a power source.

In order to further promote temperature uniformity throughout the wafer, the substrate holder can rotate within the inner diameter of the electrical heating element. In order to limit the amount of energy needed to heat the electrical heating element, a reflective plate can be positioned surrounding the electrical heating element and can be configured to reflect heat being emitted by the electrical heating element back onto the element. Alternatively or in addition to the reflective plate, a reflective coating can be applied to the electrical heating element for inhibiting the emission of thermal radiation from the element in a direction opposite the wafer. For instance, the reflective coating and/or the reflective plate can be made from a multi-layered dielectric material.

As described above, in one embodiment, the electrical heating element can be made from silicon, silicon carbide, or graphite. If desirable, an oxidation resistant coating can be applied to the electrical heating element for protecting the element from oxidation during processing. For instance, the oxidation resistant coating can be made from silicon nitride.

In one preferred embodiment of the present invention, the apparatus further includes an adjustable power source for supplying electrical energy to the electrical heating element. A temperature sensor may also be included for either monitoring the temperature of the heating element or of the wafer being heat treated within the thermal processing chamber. A controller can be placed in communication with the adjustable power source and the temperature sensing device and can receive temperature information. Based on such information, the controller can be configured to automatically adjust the power source for adjusting the amount of heat being emitted by the electrical heating element. In this manner, the temperature of the electrical heating element and/or of the wafer can be controlled and maintained within preset limits.

The temperature sensing device, when sensing the temperature of the electrical heating element, can be, for instance, a thermocouple, a pyrometer, or a device that measures the temperature of the element based on electrical resistance. When the temperature sensing device is used to sense the temperature of the wafer, on the other hand, the device is preferably a pyrometer.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
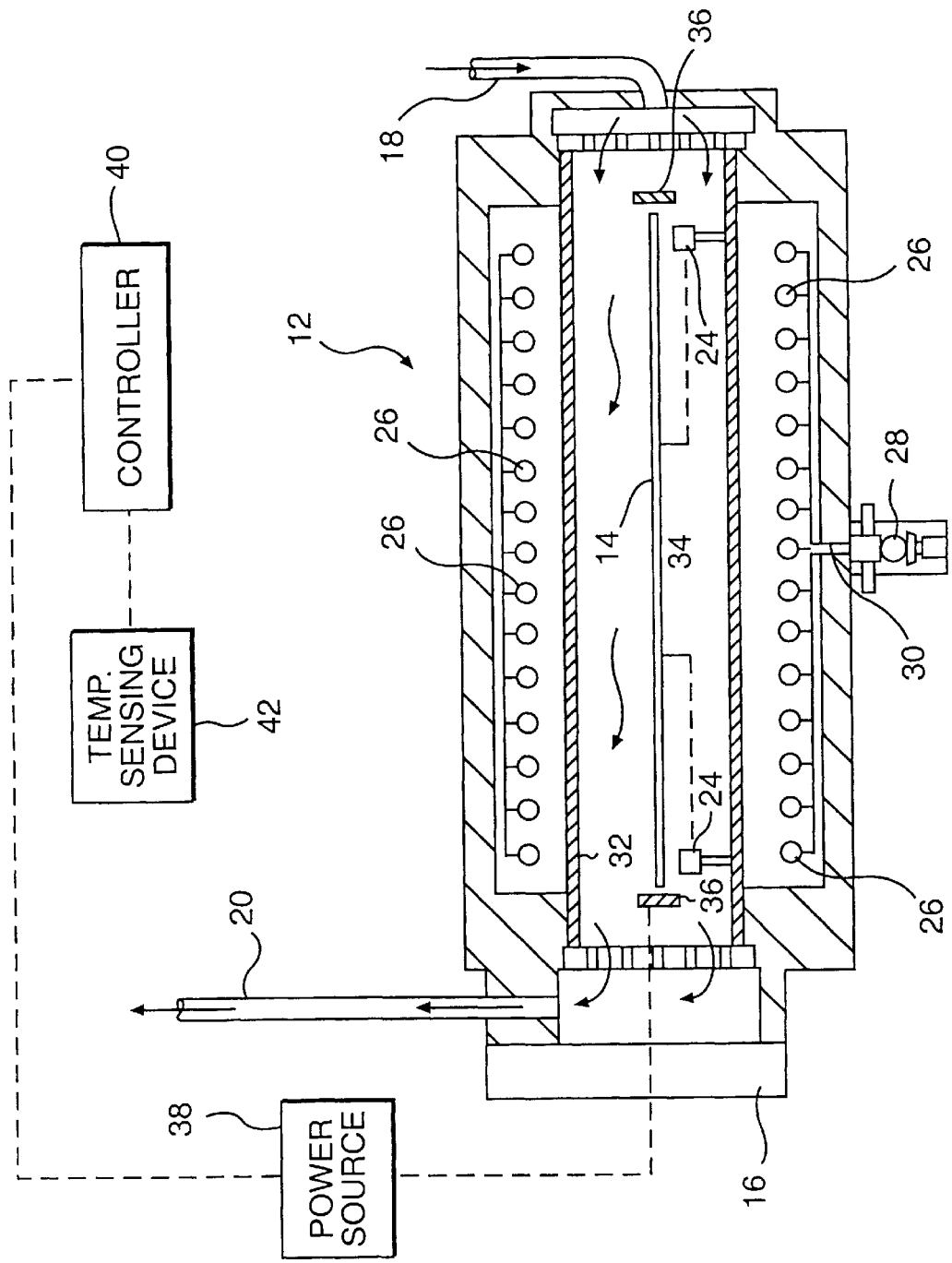
FIG. 1 is a cross-sectional view of one embodiment of an apparatus for heat treating wafers made in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for heating wafers in a thermal processing chamber. More particularly, the present invention is directed to a thermal processing chamber containing an electrically heated element that is designed to apply heat to the edges of a wafer that is being heated within the chamber. The electrical heating element compensates for heat that is typically lost through the edges of the wafer during heat treatment. The heating element of the present invention is designed to ensure that the wafer is being heated at a constant rate and uniformly.

The electrical heating element of the present invention, instead of being heated passively, can be directly heated by, for instance, passing an electrical current through the element. Direct heating of the electrical heating element permits very efficient energy coupling between the element and the wafer, which will tend to decrease the overall power requirements of the system. Of particular advantage, the electrical heating element of the present invention can have a vertical height that is substantially greater than the thickness of the wafer being heated. In this manner, small changes in the alignment of the wafer during heat treating does not affect the performance of the heating element. Also of particular advantage, the heating element can be constructed from materials which are compatible with semiconductor processing applications. Such advantages and others will be made more apparent from the following description.

Referring to FIG. 1, an apparatus made in accordance with one embodiment of the present invention for heat treating wafers, such a silicon wafers, is shown. The apparatus includes a thermal processing chamber generally 12 adapted to receive a wafer 14, for conducting various processes. In particular, thermal processing chamber 12 is designed to heat wafer 14 at very rapid rates and under carefully controlled conditions. Semiconductor wafers are loaded into and out of chamber 12 through a door 16.

Thermal processing chamber 12 can be made from various materials including metals and ceramics. For instance, chamber 12, in one embodiment, can be made from stainless steel. When chamber 12, however, is made from a heat conductive material, preferably the chamber includes a cooling system. For instance, chamber 12 can include a cooling conduit (not shown) wrapped around the perimeter of the chamber for circulating a cooling fluid, such as water, which is used to cool the chamber during operation.

As shown, thermal processing chamber 12 includes a gas inlet 18 and a gas outlet 20 for introducing and circulating a gas into the chamber if desired. For instance, a gas, such as an inert gas, can be introduced into thermal processing chamber 12 through gas inlet 18 for preventing and inhibiting any adverse chemical reactions from occurring within the chamber. The inert gas, for instance, can be nitrogen.

In an alternative embodiment, a gas can be introduced into thermal processing chamber 12 that contains a gaseous reactant. The gaseous reactant can be designed to react with wafer 14 for depositing a film or coating on the surface of the wafer.

As shown, wafer 14 is positioned within thermal processing chamber 12 on a substrate holder 24. During processing, substrate holder 24, in one embodiment, can be adapted to rotate wafer 14. Rotating the wafer promotes greater temperature uniformity over the surface of the wafer and promotes enhanced contact between wafer 14 and any gases introduced into the chamber. It should be understood, however, that besides wafers, thermal processing chamber 12 is also adapted to process optical parts, films, fibers, ribbons and other substrates having any particular shape.

In order to heat wafer 14, the system of the present invention includes a heat source in communication with thermal processing chamber 12. In the embodiment illustrated in FIG. 1, the heat source comprises a plurality of lamps 26, such as tungsten-halogen lamps, positioned below and above wafer 14. If desired, lamps 26 can be surrounded by a reflector or a set of reflectors for carefully directing thermal energy being emitted by the lamps onto wafer 14 at particular locations. Besides being placed above and below wafer 14, lamps 26 may be placed only above the wafer, only below the water and/or at any particular location.

The use of lamps 26 as a heat source is generally preferred. For instance, lamps have much higher heating and cooling rates than other heating devices, such as electrical elements or conventional furnaces. Lamps 26 create a rapid thermal processing system that provides instantaneous energy, typically requiring a very short and well controlled start up period. The flow of energy from lamps 26 can also be abruptly stopped at any time. Lamps 26 can be equipped with a gradual power controller that can be used to increase or decrease the thermal energy being emitted by the lamps.

In order to monitor the temperature of wafer 14 during operation of chamber 12, a radiation sensing device 28 is included in communication with the chamber. Radiation sensing device 28, which can be, for instance, a pyrometer, includes an optical fiber or light pipe 30 which extends from radiation sensing device 28 adjacent to wafer 14.

Light pipe 30 is configured to receive thermal energy being emitted by wafer 14 at a particular wavelength. The amount of sensed radiation is then communicated to radiation sensing device 28 which generates a usable voltage signal for determining the temperature of the wafer. In particular, by knowing the amount of thermal radiation being emitted by wafer 14 at a particular wavelength, the temperature of the object can be calculated based, in part, on Planck's Law.

During the process, light pipe 30 should only detect thermal radiation being emitted by wafer 14 and should be prevented from detecting thermal radiation being emitted by lamps 26 at the desired wavelength. In this regard, thermal processing chamber 12 includes spectral filters 32 and 34 which are positioned between lamps 26 and the end of light pipe 30. Spectral filters 32 and 34 are designed to filter out thermal radiation being emitted by lamps 26 which is at the wavelength at which radiation sensing device 28 operates. For instance, in one embodiment, spectral filters 32 and 34 are made from fused silica or quartz.

In accordance with the present invention, thermal processing chamber 12 further includes an electrical heating element 36 positioned so as to surround the peripheral edges of wafer 14. For instance, as more particularly shown in FIGS. 4 and 5, heating element 36 can be in the shape of a solid strip-like ring. As shown, the ring is vertically oriented with respect to wafer 14 and is discontinuous for providing electric terminals 50 and 52, which are adapted to be connected to an electrical power source. During operation of thermal processing chamber 12, an electrical current is fed through heating element 36 causing the element to emit heat that is absorbed by wafer 14 at its edges.

Heating element 36 can be positioned within thermal processing chamber 12 by any suitable fastening means. For instance, electrical terminals 50 and 52, as described above, can be connected to an electrical power source which maintains heating element 36 in an elevated position. Alternatively, heating element 36 can be placed on top of a holder or base. The base can be made from either an insulator or from a thermally conductive material. In one embodiment, for instance, heating element 36 can be positioned upon a base ring that has a shape similar to the slip-free ring illustrated in FIG. 2. The base ring can be made from the same material as heating element 36 and can be used to assist in heating the edges of the wafer. In this embodiment, the cross-sectional shape of the heating element in combination with the base ring can be either "L-shaped" or can have an "upside down T-shape".

Figure 2:
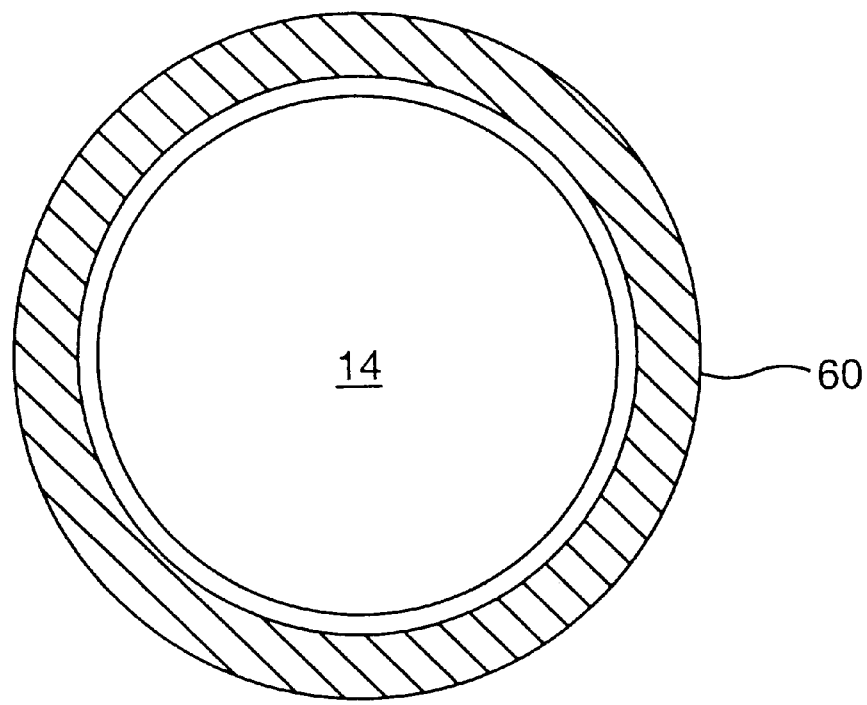
FIG. 2 is a plan view of a prior art slip-free ring.
Figure 3:
FIG. 3 is a cross-sectional view of the prior art slip-free ring illustrated in FIG. 2.

As described above, in the past, passively heated slip-free rings were used to compensate for heat loss at the wafer's edge. For instance, a prior art passively heated slip-free ring 60 is illustrated in FIGS. 2 and 3. As shown, ring 60 is designed to be very wide in order to absorb thermal radiation being emitted by the heaters within a thermal processing chamber. As shown in FIG. 3, ring 60 is also very thin so that the ring will heat up approximately at the same rate as wafer 14.

As described above, various problems and drawbacks have been experienced when using ring 60. For instance, problems have been experienced in maintaining wafer 14 and ring 60 in alignment during the heat treating process. For example, during heat treatment, wafer 14 or ring 60 may undergo some deformation due to thermal expansion which may create a misalignment between the wafer and the ring.

Another disadvantage to using ring 60 is that, because the ring is heated passively, the temperature of the ring cannot be controlled and adjusted independent of the heat treating process.

Figure 4:
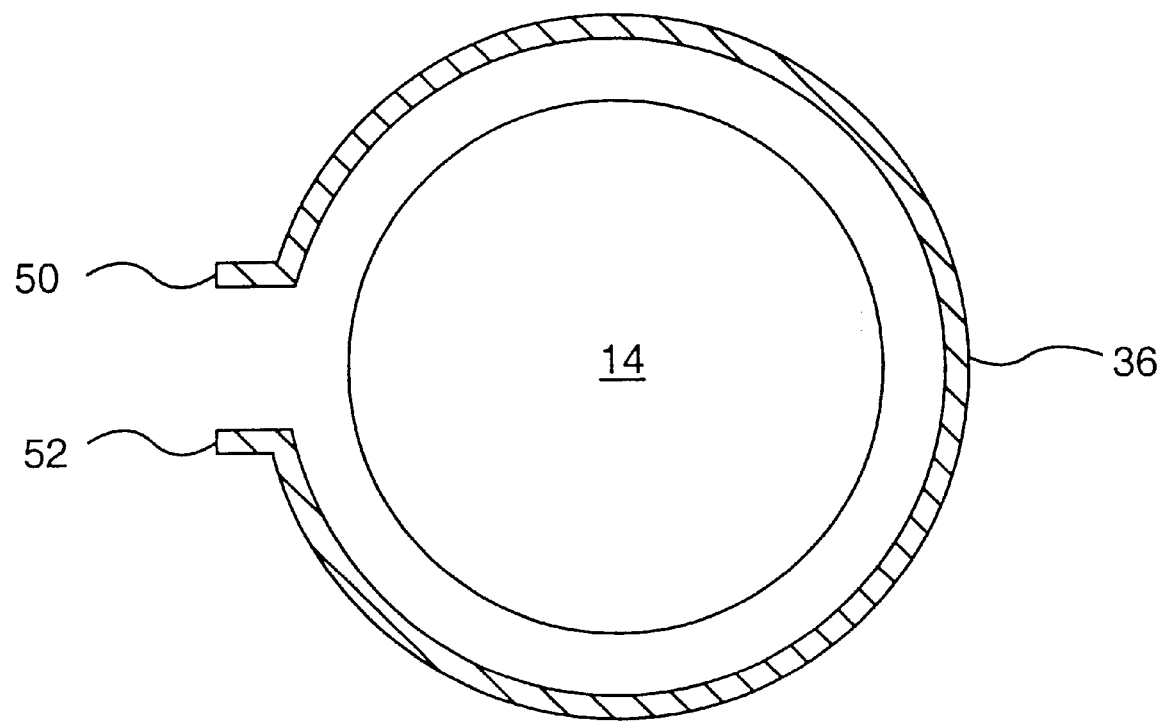
FIG. 4 is a plan view of one embodiment of an electrical heating element made in accordance with the present invention.
Figure 5:
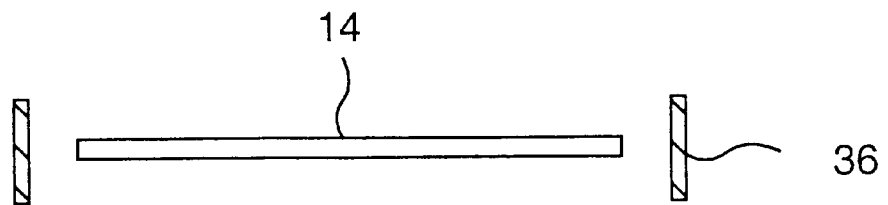
FIG. 5 is a cross-sectional view of the electrical heating element illustrated in FIG. 4.

The electrical heating element of the present invention, on the other hand, addresses these problems and provides various advantages over passively heated ring 60. For instance, because heating element 36 is not heated passively, the heating element can assume various shapes and geometries instead of having to be designed to absorb thermal energy. For example, as shown in FIG. 4, heating element 36 can be made from a thin strip of material. In this manner, heating element 36 occupies less space than the slip-free ring illustrated in FIG. 2, thus possibly reducing the volume requirements of the thermal processing chamber itself.

Further, since the heating element of the present invention is heated actively, instead of passively, the choice of material that is used to construct the heating element does not have to be dictated by the need to absorb lamp energy. Thus, various different materials can be chosen for constructing the electrical heating element of the present invention. For instance, in one embodiment, a material can be selected that has thermal behavior characteristics similar to a wafer being heated for promoting greater temperature uniformity throughout the wafer during a heat treating process.

Another advantage of the present invention is that electrical heating element 36 can, in one embodiment, have a vertical height that is substantially greater than the thickness of wafer 14. In this configuration, wafer 14 can move and reposition itself within the inside diameter of the heating element without falling out of alignment with the heating element. By having a vertical height substantially greater than the thickness of the wafer, mechanical tolerance issues and deformation of the wafer due to thermal expansion do not influence the effectiveness of the edge heating. The use of a heating element with a height significantly larger than that of the wafer also tends to decrease the temperature to which the heating element must be heated, since the edge of the wafer has a very small view factor to the walls of the thermal processing chamber, which may be at a substantially lower temperature than the wafer.

For instance, the vertical height of electrical heating element 36 can be from about 1 millimeter to about 10 millimeters, when heating wafers having a thickness of from about 0.7 millimeters to about 0.8 millimeters. For thinner wafers, the vertical height of electrical heating element can be even smaller such as about 0.5 millimeters. In a preferred embodiment, the vertical height of electrical heating element 36 is from about 2 millimeters to about 7 millimeters, and particularly from about 4 millimeters to about 5 millimeters.

In the past, besides passively heated slip-free rings, electrically heated rings have also been used. The electrically heated rings included a metal filament encased in a silica glass tube. The metal filament was encased within the glass tube in order to prevent the heated metal from contaminating the wafer. As opposed to these constructions, however, heated element 36 of the present invention is instead preferably made from a material that is more compatible with semiconductor processing applications. In particular, instead of including a metal filament, heating element 36 is preferably made from a material such as silicon, silicon carbide, graphite, or graphite coated with silicon carbide. As such, the heating element of the present invention does not have to be encased within a silica glass tube, which, when used in prior art constructions, may have even tended to cool the edge of the wafer due to its big thermal mass.

More particularly, silicon, silicon carbide, and graphite are not only well suited to being heated by electrical resistance at high temperatures but also have heating and cooling rates that are well suited for use in thermal processing chambers.

Figure 6:
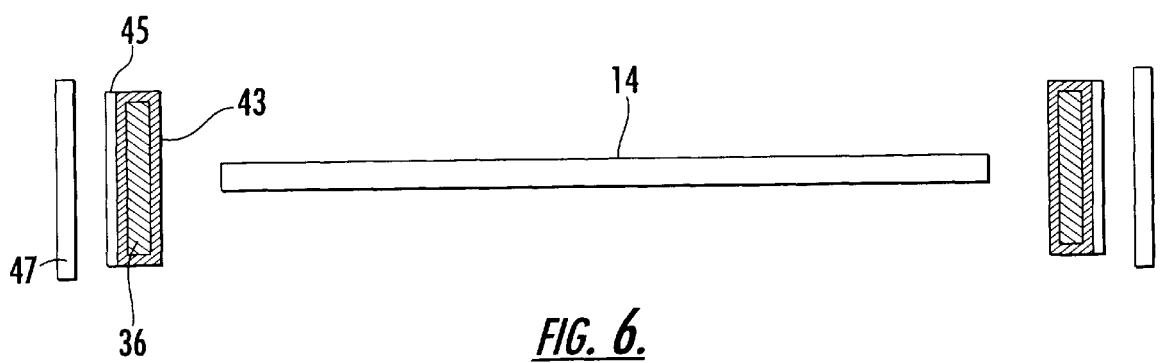
FIG. 6 is a cross sectional view of an alternative embodiment of electrical heating element made in accordance with the present invention.

Heating element 36 can be made entirely from an electrically conductive material as described above. If the material used to construct the heating element, however, is susceptible to oxidation, as shown in FIG. 6, an oxidation resistant coating 43 can be applied to the heating element. For example, if necessary to protect the heating element from the effect of an oxidizing environment, the heating element can be coated with silicon nitride. Further, if necessary, a buffer layer of silicon dioxide can be placed upon electrical heating element 36 between the electrically conductive material and the layer of silicon nitride. In this embodiment, the silicon dioxide is added in order to accommodate the stress in the silicon nitride film.

Besides oxidation resistant coatings, electrical heating element 36 may also be used in combination with reflective plates and/or coatings that are designed to prevent heat loss from the heating element and to minimize the power requirements for heating the element. For instance, in one embodiment, a ring-shaped reflective plate 47 as shown in FIG. 6 can be placed around heating element 36 which serves to reflect heat being emitted by the heating element back onto itself. Besides using a reflective plate, alternatively, the walls of the thermal processing chamber can be made reflective adjacent to the heating element 36.

In another embodiment, a reflective coating 45 may be applied to the heating element itself. For instance, when applied to the outside surface of the heating element, a reflective coating can be designed so as to decrease the heat being emitted by the heating element in a direction opposite the wafer. Alternatively, a reflective coating can be applied to the inside surface of the heating element facing the wafer. In this embodiment, the coating can be used to reflect radiation being emitted by the edge of the wafer back onto the wafer.

In one embodiment, the reflective plate and the reflective coatings can be made from a multi-layered dielectric material designed specifically for the purpose of reflecting thermal radiation being emitted by the heating element and/or the wafer. Such dielectric materials are commercially available and marketed by Deposition Sciences, Inc. located in Santa Rosa, California.

Besides having a vertical height substantially greater than the thickness of a wafer and besides being made from an electrically conductive material that does not adversely interfere with the heat treating process, another advantage to the heating element of the present invention is the ability to control the temperature of the element and to control the rate at which the element heats up during processing. In this regard, as shown in FIG. 1, heating element 36 can be coupled to an adjustable power source 38. Power source 38, for instance, can be connected to terminals 50 and 52 as shown in FIG. 4 and can supply a current of electricity through the heating element for causing the element to emit heat. Power source 38 is adjustable in that the amount of electricity being fed to heating element 36 can be varied which, in turn, varies the temperature to which the element is heated.

In one preferred embodiment of the present invention, the apparatus illustrated in FIG. 1 further includes a temperature sensing device 42 and a controller 40. In particular, temperature sensing device 42 is for monitoring the temperature of heating element 36. For example, temperature sensing device 42 can be a thermocouple placed in contact or adjacent to heating element 36, or a pyrometer that calculates the temperature of heating element 36 by monitoring the amount of thermal radiation being emitted by the element. In a further alternative embodiment, temperature sensing device 42 can also be a device that calculates the temperature of heating element 36 by measuring the electrical resistance within the element. Still, another manner in which the temperature of heating element 36 can be monitored is to calibrate power source 38 such that a relationship can be established between the temperature of heating element 36 and the amount of power being delivered to the element.

Controller 40 which can be, for instance, a microprocessor can be included within the apparatus as shown in FIG. 1 in communication with temperature sensing device 42 and adjustable power source 38. More particularly, controller 40 can be configured to receive temperature information from temperature sensing device 42 and, based on such information, automatically control adjustable power source 38 for maintaining the temperature of heating element 36 within a desired range. For instance, controller 40 can be programmed to heat electrical heating element 36 at a particular rate and according to a particular temperature regime that is appropriate and complimentary to a particular heat treating process.

Alternatively, temperature sensing device 42, instead of sensing the temperature of heating element 36, can be configured to monitor the temperature of wafer 14. For instance, temperature sensing device 42 can be in communication with radiation sensing device 28 and/or can be in communication with other radiation sensing devices contained within thermal processing chamber 12. For instance, temperature sensing device 42 can also be a separate radiation sensing device that is designed to specifically measure the temperature of wafer 14 along its edges.

In this embodiment, temperature sensing device 42 also supplies temperature information to controller 40. Controller 40 then adjusts power source 38 in response to the information received from temperature sensing device 42. In this manner, the rate or temperature to which heating element 36 is heated depends upon and is in reaction to the temperature of wafer 14.

As described above, in one preferred embodiment, the heating element of the present invention as illustrated in the figures is heated actively by an independent power source. It should be understood, however, that in other applications, it may be desirable to heat the heating element passively. In fact, it is believed that the shape of the heating element of the present invention may provide some advantages over prior art constructions in passively heated systems.

When heated passively, the heating element can be positioned within the thermal processing chamber so as to be in contact with thermal energy being emitted by a heating source, such as a plurality of lamps as illustrated in FIG. 1. Alternatively, although not necessary, the ring could also be heated by placing lamps along the walls of the thermal processing chamber so that light energy is in direct contact with the widest part of the heating element. In still another embodiment, the heating element could be heated by lasers also irradiating the heating element from the sides of the chamber, rather than from above.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only and is not intended to limit the invention so further described in such appended claims.

What is claimed is:

1. An apparatus for heat treating wafer-shaped objects comprising:

a thermal processing chamber adapted to contain wafer-shaped objects;

a heat source in communication with said thermal processing chamber for heating objects contained in said chamber;

a substrate holder for holding objects contained in said thermal processing chamber; and an electrical heating element being configured to surround the peripheral edges of a wafer-shaped object positioned on said substrate holder, said electrical heating element comprising a solid strip of an electrically conductive material capable of being heated by electrical resistance, said solid strip having a ring-like shape, said electrically conductive material being in direct association with a wafer-shaped object positioned on said substrate holder.

2. An apparatus as defined in claim 1, wherein said electrical heating element is in the shape of a circular ring having a vertical height configured to be substantially greater than the thickness of a wafer-shaped object positioned on said substrate holder, said vertical height being at least 0.5 millimeters.

3. An apparatus as defined in claim 2, wherein said vertical height of said circular ring is from about 2 millimeters to about 7 millimeters.

4. An apparatus as defined in claim 2, wherein said circular ring is discontinuous, said circular ring including at least two electrical terminals adapted to be connected to a power source.

5. An apparatus as defined in claim 1, wherein said electrical heating element is stationary and said substrate holder is configured to rotate.

6. An apparatus as defined in claim 1, further comprising a reflective plate surrounding said electrical heating element, said reflective plate reflecting heat being emitted by said electrical heating element.

7. An apparatus as defined in claim 1, further comprising an oxidation resistant coating covering said electrical heating element.

8. An apparatus as defined in claim 1, wherein said electrically conductive material comprises a material selected from the group consisting of silicon, silicon carbide, graphite and mixtures thereof.

9. An apparatus as defined in claim 1, further comprising a reflective coating applied to said electrical heating element, said reflective coating inhibiting heat from being emitted by said electrical heating element in a direction opposite a wafer-shaped object positioned on said substrate holder.

10. An apparatus for heat treating wafer-shaped objects comprising:
   a thermal processing chamber adapted to contain wafer-shaped objects;
   a heat source in communication with said thermal processing chamber for heating objects contained in said chamber;
   a substrate holder for holding objects contained in said thermal processing chamber; and
   a ring-shaped electrical heating element for minimizing heat losses through the edges of a wafer-shaped object, said ring-shaped electrical heating element comprising an electrically conductive material capable of being heated by electrical resistance, said ring-shaped heating element having an inside diameter configured to surround the peripheral edges of a wafer-shaped object positioned on said substrate holder, said ring-shaped heating element comprising a strip of material having a vertical height configured to be greater than the thickness of said wafer-shaped object, said vertical height being at least 1.0 millimeter.

11. An apparatus as defined in claim 10, wherein said vertical height of said ring-shaped structure is at least 2 millimeters.

12. An apparatus as defined in claim 10, wherein said ring-shaped structure has a vertical height of from about 2 millimeters to about 10 millimeters.

13. An apparatus as defined in claim 10, wherein said ring-shaped structure comprises a material selected from the group consisting of silicon, silicon carbide, graphite, and mixtures thereof.

14. An apparatus as defined in claim 10, further comprising an adjustable power source in communication with said ring-shaped structure for supplying electrical power to said structure.

15. An apparatus as defined in claim 14, further comprising:
   a temperature sensing device for sensing the temperature of said ring-shaped structure; and
   a controller in communication with said temperature sensing device and with said adjustable power source, said controller receiving temperature information from said temperature sensing device and, based on said information, adjusting said power source for maintaining said ring-shaped structure within a predefined temperature range.

16. An apparatus as defined in claim 15, wherein said temperature sensing device comprises a thermocouple.

17. An apparatus as defined in claim 15, wherein said temperature sensing device comprises a pyrometer.

18. An apparatus as defined in claim 15, wherein said temperature sensing device monitors the temperature of said ring-shaped structure by sensing the electrical resistance of said structure.

19. An apparatus as defined in claim 14, further comprising:
   a temperature sensing device for sensing the temperature of a wafer-shaped object contained in said thermal processing chamber; and
   a controller in communication with said temperature sensing device and with said adjustable power source, said controller receiving temperature information from said temperature sensing device and, based on said information, adjusting said power source for maintaining the temperature of said wafer-shaped object within preset limits.

20. An apparatus for heat treating wafer-shaped objects comprising:
   a thermal processing chamber adapted to contain wafer-shaped objects;
   a heat source in communication with said thermal processing chamber for heating objects contained in said chamber; and
   an electrical heating element in the shape of a discontinuous circular ring, said electrical heating element having an inside diameter configured to surround the peripheral edges of a wafer-shaped object positioned within said thermal processing chamber and configured to be in direct association with said wafer-shaped object, said electrical heating element having at least two terminals adapted to be connected to an electrical power source, said electrical heating element having a vertical height configured to be substantially greater than the thickness of said wafer-shaped object, said vertical height being at least 1 millimeter, said electrical heating element being made from an electrically conductive material comprising a material selected from the group consisting of silicon, silicon carbide, graphite and mixtures thereof.

21. An apparatus as defined in claim 20, wherein said electrical heating element has a vertical height of at least 2 millimeters.

22. An apparatus as defined in claim 20, further comprising a substrate holder positioned within said inside diameter of said electrical heating element for holding wafer-shaped objects contained within said thermal processing chamber, said substrate holder being configured to rotate said wafer-shaped objects.

23. An apparatus as defined in claim 20, further comprising:
   an adjustable power source connected to said terminals located on said electrical heating element;
   a temperature sensing device for sensing the temperature of a wafer-shaped object contained within said thermal processing chamber; and
   a controller in communication with said temperature sensing device and with said adjustable power source, said controller receiving temperature information from said temperature sensing device and, based on said information, adjusting said power source for maintaining the temperature of said wafer-shaped object within preset limits.

24. A method for compensating for heat loss dissipated through the edges of a wafer-shaped object during heat treatment in a thermal processing chamber, said process comprising the steps of:
   placing an electrical heating element around the peripheral edges of a wafer-shaped object and in direct association with said wafer-shaped object, said electrical heating element comprising a solid strip of material having a ring-like shape and having a vertical height of at least 1 millimeter; and
   while heat treating said wafer-shaped object, heating said electrical heating element to a temperature sufficient to compensate for heat loss occurring through the edges of said object.

* * * * *